United States Patent [19]

Geissler et al.

[11] Patent Number: 4,559,292

[45] Date of Patent: Dec. 17, 1985

[54] PHOTOSENSITIVE TRANSFER MATERIAL HAVING A SUPPORT OF DEFINED ROUGHNESS

[75] Inventors: Ulrich Geissler, Frankfurt am Main; Walter Herwig, Bad Soden am Taunus; Helga Sikora, Wiesbaden, all of Fed. Rep. of Germany

[73] Assignee: Hoechst Aktiengesellschaft, Frankfurt am Main, Fed. Rep. of Germany

[21] Appl. No.: 537,000

[22] Filed: Sep. 29, 1983

[30] Foreign Application Priority Data

Oct. 2, 1983 [DE] Fed. Rep. of Germany ....... 3236560

[51] Int. Cl.$^4$ ................................................. G03C 3/00
[52] U.S. Cl. .................................... 430/256; 430/258; 430/259; 430/260; 430/271; 430/273; 430/523
[58] Field of Search ............... 430/258, 271, 260, 273, 430/259, 256, 523

[56] References Cited

U.S. PATENT DOCUMENTS

| | | |
|---|---|---|
| 1,591,304 | 7/1926 | Giveans . |
| 3,010,390 | 11/1961 | Buskes . |
| 3,214,274 | 10/1965 | Ohyama et al. ..................... 430/535 |
| 3,884,693 | 5/1975 | Bauer et al. . |
| 3,891,443 | 6/1975 | Halpern et al. . |
| 3,909,328 | 9/1975 | Dessauer et al. . |
| 4,232,108 | 11/1980 | Dessauer . |
| 4,278,752 | 7/1981 | Gervay et al. . |

FOREIGN PATENT DOCUMENTS 1323792  7/1973  United Kingdom .

Primary Examiner—Jack P. Brammer
Attorney, Agent, or Firm—Schwartz, Jeffery, Schwaab, Mack, Blumenthal & Evans

[57] ABSTRACT

The present invention relates to a photosensitive transfer material, which comprises a flexible temporary support film which is preferably transparent, a thermoplastic photosensitive layer, optionally a flexible cover film on the free side of the photosensitive layer and, optionally, an intermediate layer between the support film and the photosensitive layer. The photosensitive transfer material is suitable for manufacturing photoresist stencils and solder masks. The temporary support film has a rough surface which exerts an embossing effect on the surface of the photosensitive layer and the intermediate layer, respectively. The mat-finish of the intermediate layer prevents an irregular deformation of this layer in moist air, while the mat-finish of the photosensitive layer precludes unwanted reflections.

9 Claims, No Drawings

PHOTOSENSITIVE TRANSFER MATERIAL HAVING A SUPPORT OF DEFINED ROUGHNESS

The present invention relates to a photosensitive transfer material comprising a temporary flexible support film and a thermoplastic photosensitive layer. The invention further relates to a process for manufacturing a photoresist stencil, in which a solid thermoplastic photosensitive layer is transferred to a permanent support by means of a transfer material and is exposed imagewise and developed on this permanent support.

Transfer processes and transfer materials of the above-mentioned type are, for example, described in German Pat. No. 1,522,515 or in U.S. Pat. No. 4,193,797. According to these patents, negative-working or positive-working thermoplastic photosensitive layers are transferred in the dry state, under pressure or with heating, to a permanent support and are processed into a photoresist stencil The permanent support is then modified, for example etched or electroplated, in the areas not covered by the stencil.

In British Pat. No. 1,323,792, and in U.S. Pat. No. 3,884,693, corresponding materials are described, in which a non-thermoplastic intermediate layer is applied between the photosensitive layer and the temporary support. This non-thermoplastic intermediate layer is capable of being dissolved in the developer used for processing the photosensitive layer and it has a greater adherence to the photosensitive layer than to the temporary support. These materials are processed by laminating the photosensitive layer to the permanent support and then stripping the temporary support from the intermediate layer. Only after these operations is the material contact-exposed under a master and then developed. Because the preferred intermediate layers are water-soluble, they tend to swell in the air, depending on the atmospheric humidity, and form surfaces having an irregular texture, which considerably complicates or even prevents correct exposure.

U.S. Pat. No. 4,278,752 discloses the production of solder masks according to the dry resist process. It has been found that, in this application, and also in the afore-mentioned use, the high-gloss surface of the resist layer remaining after stripping the temporary support film, is inconvenient in some cases. Under particular soldering conditions, it can also occur that threads or pellets of the solder alloy adhere to the surface of the solder mask after wave-soldering, which may possibly lead to short circuits. In addition, the glossy surface gives rise to disturbing reflections, particularly when components are manually inserted.

In the case of a dry resist, a mat resist surface with its markedly reduced reflections, compared with the copper surface, makes it possible to inspect a developed printed circuit board by optical means.

U.S. Pat. No. 3,891,443 describes photopolymerizable relief printing plates, in which the surface of the photopolymerizable layer is matted, in order to improve and accelerate contact between the master and the photopolymerizable layer in the vacuum printing frame and to improve ink receptivity in flexographic printing. Mat-finishing of the surface may, for example, be effected by contacting the surface with a matted or grained surface, for example with a roughened aluminum sheet or a roughened polyester film. In the process, the mat-finish surface is coated with a silicone in order to enable the subsequently necessary removal from the layer. Processing of a photosensitive printing plate differs widely from that of a dry resist material and the object which is, in the former case, achieved by mat-finishing the surface of the photosensitive layer, is different from the problem involved, as described above, in the processing of dry resists into solder masks or resist stencils.

It is an object of the present invention to provide a transfer material which does not give rise to problems upon exposure, if intermediate layers which are water-soluble or swellable in moist air are used and which does not show a high-gloss layer surface, after stripping the temporary support film.

The present invention provides a photosensitive transfer material of the above-described kind.

In the material according to the present invention, the support film has a rough surface facing the photosensitive layer.

According to the present invention, a process for manufacturing a photoresist stencil is further provided, in which a thermoplastic photosensitive layer, which is applied to a flexible support film, is laminated with the free surface thereof to a permanent support, and the photosensitive layer is then exposed imagewise and is developed into a relief image, after stripping the flexible support film.

In the process of the invention, a transparent support film is used, in which the surface carrying the photosensitive layer is rough and the photosensitive layer is exposed through the support film, before the latter is stripped.

According to a further embodiment of the process of this invention, a transfer material comprising a temporary support film, a thin intermediate layer which does not become tacky upon heating to temperatures up to about 150° C., and a thermoplastic photosensitive layer applied on top of the intermediate layer, the intermediate layer adhering more firmly to the photosensitive layer than to the support film and being soluble in a developing liquid used for the photosensitive layer, is laminated to a permanent support with the free surface of the photosensitive layer, the temporary support film is stripped and the photosensitive layer is exposed imagewise and developed into a relief image.

In the process of the invention a temporary support film is used, which has a rough surface, on which the intermediate layer and the photosensitive layer are present.

Preferably, the surface of the transfer material of the present invention, which faces away from the temporary support film, carries a cover film with less adherence to the photosensitive layer than the support film.

The rough surface of the temporary support film can be produced by mechanical roughening, for example by sandblasting, or by embedding minute particles. A preferred film comprises in its mass uniformly distributed particles, for example, of silicon dioxide, talcum, magnesium oxide, boron nitride, aluminum oxide or high-melting insoluble organic substances. The amount of particles preferably ranges from about 0.5 to 6 percent by weight, based upon the weight of the film.

The roughness of the support film should, in general, be in the range from 0.3 to 10 μm, preferably from 0.5 to 5 μm. Roughnesses in the upper region of the ranges given are employed for thicker photosensitive layers and those in the lower region for thin layers, in particular, if the relatively thin intermediate layers are present.

If the roughness of the film surface is produced by embedding particles in the film, the particle size is, on an average, slightly greater than the desired roughness; particle size may, for example, amount to 1.5 to 2.5 times the desired roughness.

The temporary support film should be transparent in those cases in which an intermediate layer is not used. It is then necessary to select the amount and the index of refraction of the embedded particles in such a way that transparency is not substantially affected. For this purpose, a combination of polyethylene terephthalate films with silicon dioxide particles has proved particularly favorable. Generally, the film may comprise the materials specified in U.S. Pat. No. 3,884,693.

U.S. Pat. No. 3,884,693 also mentions materials which are suitable for the preparation of the intermediate layer. Advantageous substances are, for example, polyvinyl alcohol, polyvinylpyrrolidone and acrylamide polymers. The intermediate layer has a thickness ranging from about 0.05 to 8 $\mu$m, preferably from 1 to 5 $\mu$m.

It may be particularly advantageous to add a small amount of at least one constituent of the photosensitive layer to the intermediate layer. Such an addition will have a favorable effect on the adherence to the photosensitive layer and the separation from the support film. This embodiment has proved particularly useful, if the photosensitive layer comprises a photopolymerizable layer and if the layer constituent added to the intermediate layer is, in the first place, the polymerizable compound.

The photosensitive layer may comprise a positive-working or a negative-working layer, i.e. it is either solubilized or hardened by exposure. Usually, photopolymerizable layers are preferred, which are generally composed of a polymerizable compound, particularly a compound with at least two acrylic acid ester or methacrylic acid ester groups, a photoinitiator for the free-radical initiated chain polymerization, a polymeric binder, and other conventional additives. Layers of this kind and other negative-working layers are, for example, described in German Pat. No. 1,522,515, U.S. Pat. Nos. 3,884,693 and 4,278,752, and in German Offenlegungsschrift No. 3,036,694.

Suitable positive-working layers are, in particular, those based on 1,2-quinone diazides or acid cleavable compounds. Layers of this kind are described in U.S. Pat. Nos. 4,193,797; 4,101,323; and 4,247,611.

The free side of the photosensitive layer is preferably covered with a cover film with less adherence to the photosensitive layer than the temporary support film, for example, a film of polyethylene.

The material according to the present invention is processed in such a manner that the optionally present cover film is removed and the uncovered or free surface of the thermoplastic photosensitive layer is, preferably under pressure and with heating, laminated to the permanent support, preferably a circuit board or a copper-clad base material, respectively. If there is no intermediate layer between the temporary support film and the photosensitive layer, exposure is subsequently effected through the support film, the support film is stripped and the exposed photosensitive layer is developed. In the case of a solder mask, development is followed by tempering. Due to the mat appearance thereof, the surface of the resist stencil is readily visually distinguished from the uncovered copper surface so that evaluation of the copy is facilitated. In the subsequent soldering operation, the mat surface of the solder mask surprisingly remains free from threads or pellets formed from the solder, for example, a lead-tin alloy.

If a conventional photoresist stencil is involved, development is followed by etching the uncovered base metal or depositing metal thereupon, usually in an electroplating process.

In the processing of a material which comprises an intermediate layer between the support film and the photosensitive layer, the support film is stripped after the laminating process and the master is then placed upon the intermediate layer which has been embossed by the rough surface of the support film. The intermediate layer which is textured or matted as a result of the embossing effect does not show any tendency to irregular swelling or distortion phenomena, even when it is kept in moist air for a prolonged period, so that perfect contact printing is possible.

If the photosensitive layer comprises a photopolymerizable mixture and is, therefore, sensitive to atmospheric oxygen, care must be taken that the intermediate layer applied is not thinner than the surface roughness of the support film. Otherwise, there is a risk that this layer, which simultaneously serves as an oxygen barrier, is interrupted in places and there loses its protective function. Generally, it is still possible to obtain continuous polyvinyl alcohol layers, if layer thicknesses are only slightly greater, approximately by a few tenths of a $\mu$m, than the maximum roughness of the film.

The materials of the present invention are contact-exposed under transparent masters, using short wave visible or ultraviolet light supplied by conventional printing lamps, as is known in the art. It is also possible to image the layers by means of laser irradiation. It is a particular advantage that the invention also results in a reduction of the required quantity of light, i.e., in an increase of the effective photosensitivity.

The following examples describe preferred embodiments of the invention. Percentages and quantitative ratios are to be understood as denoting units of weight, unless otherwise indicated. Parts by weight (p.b.w.) are related to parts by volume (p.b.v.) as the g is related to the ml.

EXAMPLE 1

A coating solution was prepared of 13 p.b.w. of a terpolymer formed from n-hexyl methacrylate, methacrylic acid and styrene (60:30:10), having an average molecular weight of about 35,000 and an acid number of 195, 4.4 p.b.w. of polyethylene glycol-400-dimethacrylate, 1.6 p.b.w. of an elastomeric reaction product of glycidyl methacrylate, adipic acid and an oligomeric diisocyanate obtained by reacting tolylene diisocyanate with a polybutane-1,4-diol (cf. German Offenlegungsschrift No. 3,036,694), 1 p.b.w. of hexamethoxymethyl melamine, 0.2 p.b.w. of 9-phenyl acridine, 0.01 p.b.w. of a blue azo dye obtained by coupling 2,4-dinitro-6-chlorobenzenediazonium salt with 2-methoxy-5-acetylamino-N,N-diethylaniline, and 0.03 p.b.w. of 1,4-bis-(4-tert. butoxy-phenylamino)-5,8-dihydroxyanthraquinone in 30 p.b.w. of butanone, and 5.0 p.b.w. of ethanol.

110 cm wide webs of 23 $\mu$m thick polyethylene terephthalate films, one film being smooth and the other pigmented with porous silicon dioxide having an average particle diameter of 1 $\mu$m, were continuously coated with this solution, by means of a slot die. After passing through a drying zone, the resist layers had, in each case, a thickness of 100 μm and were then covered with a 25 μm thick polypropylene film. A slitter was used to cut the dry resist films thus produced into handy resist rolls which had a width of 45 cm and a web length of 50 m.

The laminating tests were carried out using test boards of an epoxy-fiberglass laminate, provided with approximately 65 μm thick conductive paths of copper having a tin-plated surface and plated-through holes. The widths and distances of the conductive paths were in the range between 200 and 1000 μm; the holes had diameters ranging from 0.6 to 4 mm.

The solder resist layers of 100 μm thickness were laminated to these boards at 120° C., using a commerical laminator.

In a commercial exposure apparatus with a 5 kW metal halide lamp, the boards were exposed for 25 seconds through a master covering the pads and holes to be soldered, then developed with an 0.8 percent concentration soda solution for 150 seconds in a commercial spray processor, and blown dry. The printed circuit boards prepared in this way were subsequently baked for 60 minutes at 150° C. in a drying cabinet. After cooling down, the boards were wetted with a flux, TL 33-16 manufactured by Alpha Grillo, and then passed over a commercial lead-tin wave-soldering bath at 250° C., at a conveying speed of 1.0 m/min.

The printed circuit boards which had been coated with the above-described mat-finish solder mask were absolutely clean after soldering and cleaning.

Under particular soldering conditions (for example, if the film of flux had insufficiently dried), the solder resist layer which had been transferred from a smooth polyester film developed defects caused by pellets or threads of the solder which adhered to the solder mask and could not be removed, even by a cleaning operation. Such defects will lead to short circuits and the printed circuit board is useless.

Obviously, lead-tin particles adhere less to a mat-finish, i.e. roughened resist surface, than to a glossy, i.e., planar, surface.

EXAMPLE 2

Coating solutions were prepared as described in Example 1, in which the following monomers were substituted for polyethyleneglycol-400-dimethacrylate:
(a) reaction product of 2,2,4-trimethyl-hexamethylene-diisocyanate and hydroxyethyl methacrylate,
(b) reaction product of triethylene glycol, 2,2,4-trimethyl-hexamethylene-diisocyanate and hydroxyethyl methacrylate,
(c) 2,2-bis-[4-(2-acryloyloxy-propoxy)phenyl]propane.

As indicated in Example 1, the solutions were coated upon a smooth polyester film, and a polyester film which had been pigmented with silica gel and polypropylene films were laminated to the layers after drying. The dry resist films were processed as described in Example 1.

In this example, it was again found that no lead-tin residue adheres to the mat surface of the solder mask after soldering, whereas in the glossy surface adhering residue occurs under unfavorable conditions.

EXAMPLE 3

A. The solution for preparing the photosensitive layer had the following composition:

6.5 p.b.w. of a terpolymer formed from n-hexylmethacrylate, methacrylic acid and styrene (60:30:10), having an average molecular weight of about 35,000 and an acid number of 195,
3.2 p.b.w. of polyethyleneglycol-400-dimethacrylate,
0.8 p.b.w. of the elastomer mentioned in Example 1,
0.1 p.b.w. of 9-phenyl acridine,
0.035 p.b.w. of an azo dye, obtained by coupling 2,4-dinitro-6-chlorobenzenediazonium salt with 2-methoxy-5-acetylamino-N-cyanoethyl-N-hydroxyethyl-aniline,
10 p.b.w. of methylethylketone, and
1 p.b.w. of ethanol.

B. The solution for preparing the intermediate layer had the following composition:
200 p.b.w. of a 7 percent concentration aqueous polyvinyl alcohol solution,
1 p.b.w. of polyethyleneglycol-400-dimethacrylate, and
0.002 p.b.w. of crystal violet.

C. A biaxially stretched and heat-set polyethylene terephthalate film which had a thickness of 25 μm and had been provided with an about 1 μm thick intermediate layer of polyvinyl alcohol, using solution B, was spin-coated with coating solution A, in such a way that a layer weight of 40 g/m² was obtained after drying at 100° C.

D. Operation C was repeated, however, using a polyethylene terephthalate film which had a rough surface resulting from an addition of about 1.5% by weight of porous silicon dioxide having an average particle size of 1 μm.

A commercial laminator was employed for laminating the dry resist films obtained according to C and D at 120° C. to glass fiber reinforced epoxy laminates, clad with 17.5 μm thick copper foils. After cooling to room temperature, the polyester films were stripped.

The surface conditions were observed and recorded as a function of time and atmospheric humidity:

| Storage time in minutes | 2 | 2 | 4 | 4 | 180 | 180 |
|---|---|---|---|---|---|---|
| relative humidity in % | 30 | 80 | 30 | 80 | 30 | 80 |
| C | + (glossy) | − | (−) | − | − | − |
| D | mat + | mat + | mat + | mat + | mat + | mat + |

+ useful, unchanged surfaces
(−) incipient irregular distortion ⎫
                                    ⎬ useless surfaces
− strong irregular distortion ⎭

EXAMPLE 4

For the production of dry resist films on a commercial scale, the following procedure was employed:

A 100 cm wide web of a 25 μm thick polyester film which had a rough surface, as indicated in Example 3D and had been precoated with polyvinyl alcohol, was continuously coated with a solution of the composition specified in Example 3A, using a slot die. After passing through a drying zone, the resist layer had a thickness of 38 μm and was covered with a polypropylene film. The dry resist film thus produced was stored on a large size roll. By means of a slitter, the large size roll was subsequently cut into handy resist rolls which had a width of 45 cm and a web length of 50 m. By adjusting to an optimum winding tension it was ensured that the roll was, layer by layer, uniformly arranged on the supporting core and did not slip off laterally, i.e., did not telescope.

For comparison, resist rolls were prepared with the same coating solution, however, the polyester film employed had no mat finish and an intermediate layer of polyvinyl alcohol was not provided.

Using a commercial laminator, the films obtained were laminated at 120° C. to glass fiber reinforced epoxy laminates, clad with 17.5 μm thick copper foils and were then—in the case of the boards having a polyvinyl alcohol intermediate layer, after stripping the support film—exposed in a commercial exposure apparatus (output 5 kW). The master employed was a line original having line widths and distances down to 60 μm.

After exposure, the layers were developed with an 0.8% concentration sodium carbonate solution for 60 seconds in a spray processor.

The boards were rinsed for 30 seconds with tap water, pre-etched for 30 seconds in a 15% concentration solution of ammonium peroxydisulfate and then electroplated for 60 minutes in a copper electrolyte bath, Type "GlanzkupferBad", manufactured by Schloetter, Geislingen/Steige, Federal Republic of Germany.

Current Density: 2.5 A/dm$^2$
Metal Build-Up: about 30 μm.

The following table lists the photosensitivities of the two resist materials, determined with the aid of the wedge steps of the step guide serving as the master and also the widths of the copper paths deposited by electroplating, with respect to three different widths in the master.

| Exposure time in seconds | 1 | 2 | 3 | 4 | 5 | 6 | 7 |
|---|---|---|---|---|---|---|---|
| Wedge Steps Example 4 | 4.7 | 5.1 | 5.9 | 6.0 | 6.8 | 7.1 | 7.4 |
| Wedge steps reference sample | 3.1 | 4.0 | 4.6 | 5.0 | 5.5 | 6.0 | 6.5 |
| Width of copper path for width of 198 μm in the master Example 4 | 198 | 190 | 186 | 180 | 178 | 176 | 174 |
| Width of copper path reference sample | 220 | 210 | 207 | 198 | 192 | 187 | 180 |
| Width of copper path for width of 102 μm in the master Example 4 | 102 | 98 | 94 | 91 | 88 | 85 | 80 |
| Width of copper path reference sample | — | 110 | 102 | 96 | 92 | — | — |
| Width of copper path for width of 76 μm in the master Example 4 | 75 | 70 | 68 | 66 | 64 | — | — |
| Width of copper path reference sample | ←decreasing resistance to developer ← →deterioration of widths of paths → | | | | | | |

EXAMPLE 5

The dry resist film described in Example 4 was laminated at 120° C. to a 25×16 cm glass fiber reinforced epoxy laminate, clad with a 17.5 μm thick copper foil. After storing for 10 minutes, the support film was stripped. The board was irradiated with 150 mW and 1,200 lines/2.54 cm (corresponding to 4 mJ/cm$^2$) on a commercial laser irradiating device (LASERITE® 150R, manufactured by Eocom Division of American Hoechst Corporation), equipped with an argon ion laser. In the procedure, the LASERITE device was coupled with an interposed computer, so that a circuit pattern was produced on the resist layer by way of a non-material master. The non-material image included straight and curved lines at various angular positions, for producing line widths and distances ranging between 200 μm and 70 μm. After irradiation, the board was developed in a 0.8% concentration sodium carbonate solution. The resist flanks at the conductive paths had sharp outlines. The resist stencil was an exact reproduction of the non-material master, independently of the position and shape of the paths stored.

The baked resist stencil exhibited a very good resistance to electroplating baths so that the board could be provided with faultless and firmly adhering copper paths, for example, in the copper electroplating bath, "GlanzkupferBad", mentioned in Example 4.

EXAMPLE 6

For producing a positive-working dry resist material, the following coating solutions were prepared:

A. Photosensitive Layer:
  34.5 p.b.w. of ethylene glycol monomethyl ether,
  21.0 p.b.w. of butanone,
  27.5 p.b.w. of a cresol-formaldehyde novolak having a softening range from 105° to 120° C., determined according to the capillary method, DIN 53,181,
  5.4 p.b.w. of polyethylene glycol (molecular weight 2000),
  9.7 p.b.w. of the polyacetal formed from 2-ethylbutyraldehyde and triethyleneglycol,
  0.3 p.b.w. of 2-(4-ethoxy-naphth-1-yl)-4,6-bis-trichloromethyl-s-triazine,
  1.9 p.b.w. of a commercial coating auxiliary based on a silicone, and
  0.02 p.b.w. of crystal violet base.

B. Intermediate Layer:
  200 p.b.w. of a 7% concentration aqueous polyvinyl alcohol solution, and
  1 p.b.w. of polyethylene glycol (molecular weight 2000).

Solution B was used to apply a 1.4 to 1.8 μm thick polyvinyl alcohol layer to a biaxially stretched and heatset polyethylene terephthalate film with a rough surface, containing 1.5% by weight of pyrogenic silicon dioxide of an average particle size of 1 μm and, on top of this layer, coating solution A was spin-coated in such a way that a layer weight of 45 g/m$^2$ was obtained after drying at 90° to 110° C.

The dry resist film thus produced was laminated to a glass fiber reinforced epoxy laminate clad with a 17.5 μm thick copper foil, by means of a commercial laminator, at 110° C. After cooling for ten minutes, the polyester film could be stripped without difficulty. The satin finish surface of the polyvinyl alcohol layer did not change, even after storing for more than 2 hours in a room at 70% relative humidity and 25° C.

The coated board was exposed under a master in the usual manner and developed with a 3.5% concentration trisodium phosphate solution. The uncovered copper paths were etched with an iron-III-chloride solution and the resulting circuit pattern had vertical flanks.

It will be obvious to those skilled in the art that many modifications may be made within the scope of the present invention without departing from the spirit thereof, and the invention includes all such modifications.

What is claimed is:

1. A photosensitive transfer material comprising
(a) a thermoplastic photosensitive layer having a first surface and a second surface;
(b) a temporary flexible support film facing said first surface; and
(c) a removable cover film applied to said second surface, said cover film adhering to said photosensitive layer less strongly than said support film adheres to said photosensitive layer, the surface of said support film which faces said first surface of said photosensitive layer having an average surface roughness in the range of from 0.5 to 5 $\mu$m.

2. A photosensitive transfer material as claimed in claim 1, wherein the support film is transparent.

3. A photosensitive transfer material as claimed in claim 1, including, between the photosensitive layer and the support film, a thin intermediate layer which adheres more firmly to the photosensitive layer than to the support film, which does not become tacky upon heating to temperatures up to 150° C., and which is soluble in a developing liquid used for the photosensitive layer.

4. A photosensitive transfer material as claimed in claim 3, wherein the intermediate layer has a thickness ranging from 1 to 5 $\mu$m.

5. A photosensitive transfer material as claimed in claim 3, wherein the intermediate layer is water-soluble.

6. A photosensitive transfer material as claimed in claim 3, wherein the intermediate layer comprises a minor amount of at least one constituent of the photosensitive layer.

7. A photosensitive transfer material as claimed in claim 1, wherein the photosensitive layer comprises a photopolymerizable layer.

8. A photosensitive transfer material as claimed in claim 1, wherein said photosensitive layer is embossed by said surface roughness of said support film.

9. A photosensitive transfer material as claimed in claim 3, wherein said intermediate layer is embossed by said surface roughness of said support film.

* * * * *